United States Patent [19]

Ritchie

[11] Patent Number: 4,803,418

[45] Date of Patent: Feb. 7, 1989

[54] IN-LINE ELECTRICAL SWITCH FOR AC POWER SUPPLY

[76] Inventor: Gordon S. Ritchie, 44B Gore Road, Victoria Park, Hackney, London, England, E9 7HP

[21] Appl. No.: 90,579

[22] Filed: Aug. 28, 1987

[30] Foreign Application Priority Data

Sep. 2, 1986 [GB] United Kingdom ................. 8621209
Feb. 23, 1987 [GB] United Kingdom ................. 8704151

[51] Int. Cl.$^4$ ......................................... H03K 17/945
[52] U.S. Cl. .................................... 323/324; 307/117; 307/632; 323/904; 323/905
[58] Field of Search ....................... 323/324, 904, 905; 307/117, 632; 315/DIG. 4

[56] References Cited

U.S. PATENT DOCUMENTS

| 3,784,843 | 1/1974 | Gustus | 307/117 |
| 4,246,533 | 1/1981 | Chiang | 323/904 |
| 4,305,006 | 12/1981 | Walhall et al. | 307/117 |
| 4,504,778 | 3/1985 | Evans | 323/324 |
| 4,678,985 | 7/1987 | Moskin | 307/632 |
| 4,716,301 | 12/1987 | Willmott et al. | 307/115 |

FOREIGN PATENT DOCUMENTS

| 3433651 | 3/1986 | Fed. Rep. of Germany | 307/632 |
| 136172 | 10/1981 | Japan | 323/324 |
| 200313 | 11/1983 | Japan | 323/324 |
| 1423311 | 2/1976 | United Kingdom . |
| 1480613 | 7/1977 | United Kingdom . |
| 1490221 | 10/1977 | United Kingdom . |
| 1550303 | 8/1979 | United Kingdom . |
| 1564870 | 4/1980 | United Kingdom . |

Primary Examiner—William H. Beha, Jr.
Attorney, Agent, or Firm—Bromberg, Sunstein & Casselman

[57] ABSTRACT

A proximity switch e.g. for a domestic a.c. supply is connected in-line e.g. in the live line of the supply between live and switch live terminals. No direct connection is made to the neutral line. Switching is performed by a triac T which receives a gate input 17 from a control circuit K that includes a proximity switch (FIGS. 5, 6). The control circuit K has a power supply comprising a charge storage capacitor C1 that is charged from the live terminal through a first impedance (diodes D3, D4) and a unidirectional first path through diode D1 when the triac T is conductive. When the triac T is switched to a non-conductive state, the capacitor C1 is charged from the switch live terminal through a second unidirectional path including diode D1 and a second impedance R2.

25 Claims, 5 Drawing Sheets

IN-LINE ELECTRICAL SWITCH FOR AC POWER SUPPLY

DESCRIPTION

1. Field of the Invention

This invention relates to an electrical switch suitable for example for mains powered electric lighting.

2. Background to the Invention

Touch sensitive electrical switches are known for switching an a.c. domestic mains supply. Such switches have a pair of electrodes which in use are bridged by application of a finger of the operator, to cause an electrical switching action. Such touch sensitive switches have been configured to operate "in-line". This means that the switch is connected in a break in e.g. the live line of an a.c. supply between resulting terminals which are known as the line and switch line terminals, without connection to the other a.c. supply line e.g. the neutral line. Thus when connected in the live line, the line and switch line terminals may be termed the live and switch live terminals. This can be seen more clearly from FIG. 1, wherein by way of example FIG. 1(a) shows an unswitched a.c. supply to a lamp, FIG. 1(b) shows schematically an "in-line" switch SW connected in a single one of the a.c. supply lines (the live line) between line L and switch line SWL terminals, whereas FIGS. 1(c) and 1(d) show switches which are not "in-line" because they are connected to both the line and neutral a.c. lines. Because the touch sensitive switches can be configured to operate "in-line" they can be used in homes to replace conventional mechanical light switches which are usually connected in-line.

It is also known to provide a proximity switch for mains powered lighting, which is operated by bringing a suitable target, for example a hand, sufficiently close to the switch (but not necessarily touching it). Typically the switch will operate when the hand is brought within 5 to 100 mm of the switch. However, due to the more complex switching arrangements used in proximity switches it has been necessary to provide such arrangements with a smooth continuous power supply derived from the a.c. supply, which hitherto has required connections to both the live and neutral supply lines. Thus hitherto, proximity switches have not been suitable for in-line use, with the disadvantage that they cannot be used as replacements for conventional domestic mechanical light switches.

Known in-line switches (e.g. touch switches) which employ electronic switching elements include a coil in series with the switching element e.g. a triac, and function by conduction angle controlled means frequency switching. When such switches are "on" or "closed" they are in fact off for a given minimum, non-zero function of every mains half cycle. A typical maximum conduction angle is 150° (rather than 180°). In this way the mean voltage across the coil is some non-zero minimum value big enough to provide continuous power for the electronic switching element and associated circuitry. Such power supplies are therefore switching power supplies, and produce RFI which has to be suppressed in accordance with various engineering standards such as BS800.

SUMMARY OF THE INVENTION

Broadly stated, the present invention provides an in-line proximity switch.

More particularly the invention provides an in-line proximity switch for connection in an electrical circuit including a load and first and second current supply conductors connected to the load, the switch comprising: line and switch line terminals, semiconductor switching means operative to switch current flow between the terminals, and control means including a proximity switching device operative in response to a target being placed proximate to but not actually touching the device, and drive means responsive to operation of the proximity switching device for operating the semiconductor switching means, wherein said switch is arranged to be connected solely into one of said current supply conductors by means of said line and switch line terminals.

Further, the invention provides a switch which employs an in-line power supply that is an improvement over known in-line power supplies in that it is not a switching power supply and so does not produce appreciate RFI.

Accordingly, the invention provides an electrical switch including semiconductor switching means connected for switching a current supply line between line and switched line terminals, the switching means being powered from a power supply including charge storage means, and means for establishing first and second charging current supply paths extending respectively from the line and switched line terminals to the charge storage means.

A switch according to the invention with its improved power supply can be driven by a proximity switching device and operate in-line, or can be driven by other switching control devices such as dimmer controls or touch sensitive switches.

BRIEF DESCRIPTION OF THE DRAWINGS

In order that the invention be more fully understood an embodiment thereof will now be described with reference to the accompanying drawings hereunder whereof.

DESCRIPTION OF EMBODIMENTS

A suitable non-switching power supply is now described with reference to FIG. 2, which is a block schematic diagram of an in-line proximity switch.

Figure 1:
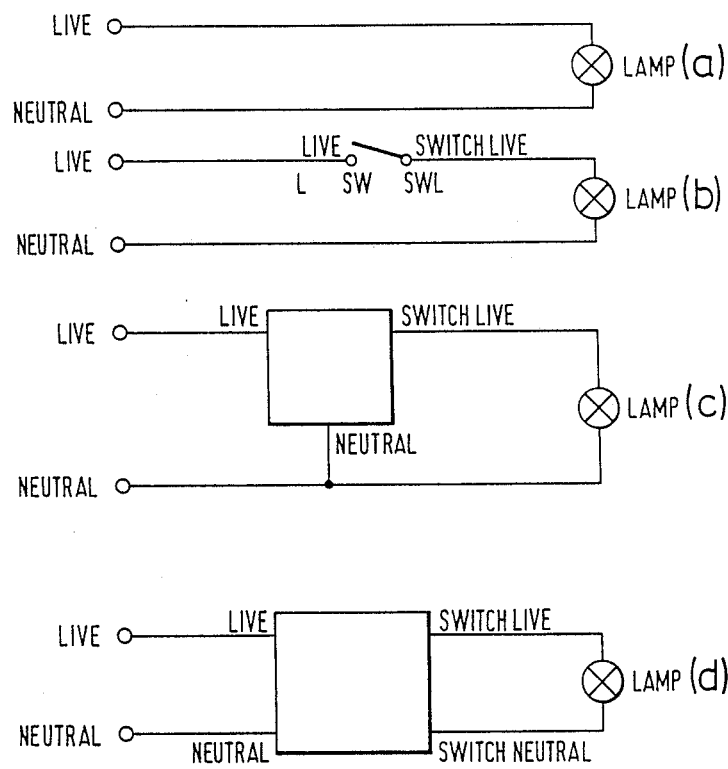
FIGS. 1(a) to 1(d) are schematic diagrams of circuits showing different lamp and switch connections as discussed hereinbefore.
Figure 2:
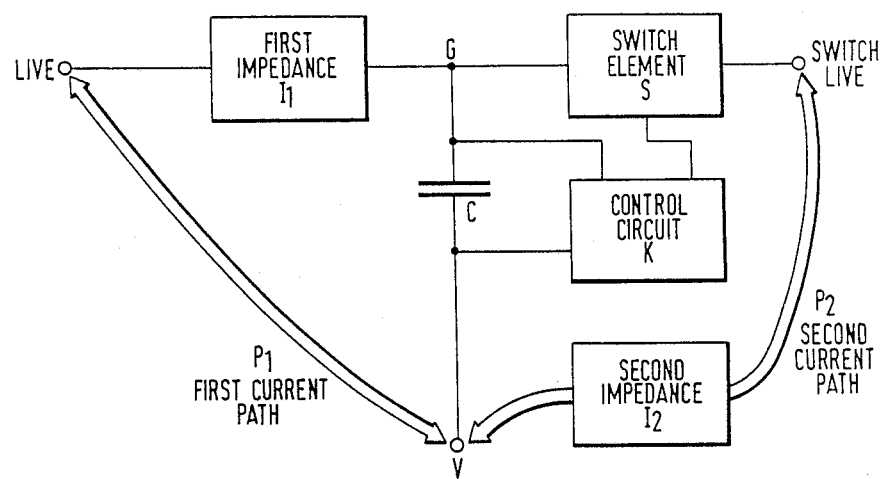
FIG. 2 is a schematic circuit diagram of a power supply used in a switch according to the invention.

Referring to FIG. 2, a first impedance I1 and a switch element e.g. a triac S are connected in series between the live and switch live terminals L and SWL in the manner shown schematically in FIG. 1(b). The potential of the connection between impedance I1 and element S is chosen to be ground for convenience, and is called G. The switch element is driven by a control circuit K that conveniently includes a proximity switch as will be described hereinafter. The circuit K is powered from a power supply that includes a capacitor C1 provided between G and the point V to store energy. A first current path (preferably unidirectional) P1 is provided from the live terminal to V, and a second current path P2 (preferably unidirectional) is provided between the switch live terminal and V through a second impedance I2. A feature of this power supply and switch element S is that the two terminals may be reversed in mains systems without impairing its function, because of the symmetry of the a.c. supply.

When the switch element S is closed i.e. conductive, current flows through the first impedance I1 generating a voltage across it. This voltage drives current through the first current path P1 to charge the reservoir capacitor C1. When the switch element is open i.e. non-conductive, neglible current flows through the first impedance I1, and hence neglible voltage is generated across it. Since the switch is connected in an a.c. circuit through a load e.g. a lamp as shown in FIG. 1(b), current instead flows along the second current path P2 through the second impedance I2, thereby charging the capacitor C1. C1 then provides the required energy for the control circuit K which drives the switch S.

Figure 3:
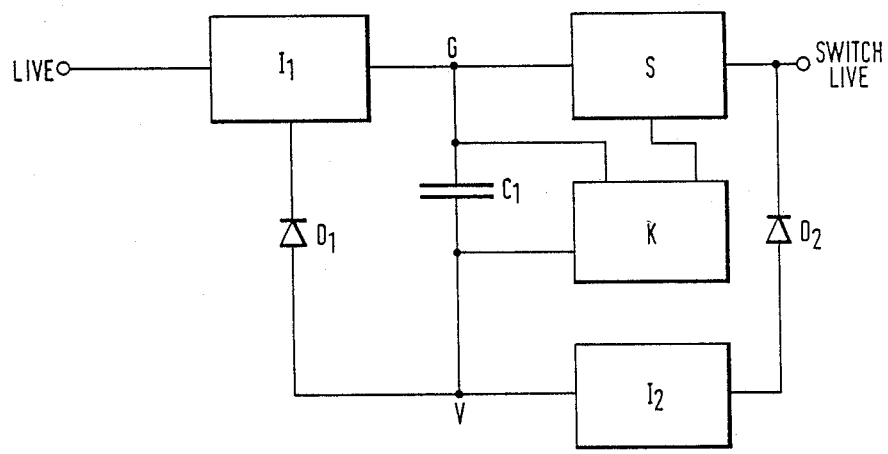
FIG. 3 is a schematic circuit diagram of a more specific example of a power supply for use in a switch according to the invention.

FIG. 3 shows a particular example of FIG. 2 wherein a diode D1 provides a unidirectional first current path and a diode D2 provides a unidirectional second current path through the second impedance I2. Both paths thereby charge the capacitor C1 so that V is at a negative potential with respect to G. When the switching element S is a triac, drive is more efficient with a negative voltage powered circuit K.

Figure 4:
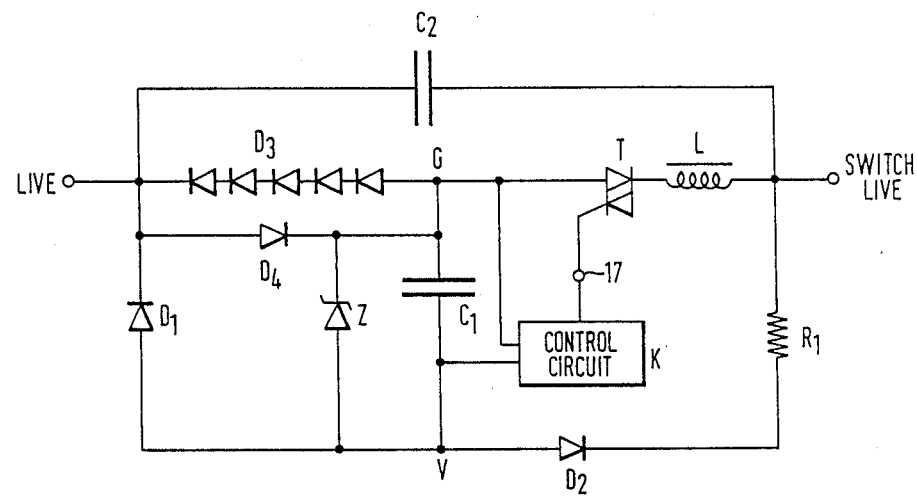
FIG. 4 is a circuit diagram of a preferred non-switching power supply for an in-line proximity switch.

Referring to FIG. 4, the first impedance I1 of FIG. 3 is implemented by a five series diodes D3 in inverse parallel with D4. This combination makes a sort of zener diode at 3 volts. When the triac T is on, the live terminal is −3 volts with respect to G (at zero volts) every other half cycle, and C1 is charged through D3 to −2.4 volts at V. When the triac is off, the switch live terminal sees (through the neutral line and the circuit load—not shown) approximately 240 V ac with respect to G and so the second current path comprising R, D4, allows C1 to be charged to a negative voltage limited by a zener diode Z. Capacitor C2 is included for dv/dt limiting across the triac T and spike suppression, and small inductance coil L is included as a dI/dt limiter.

Thus, in use the control circuit K can be used to switch the conductive state of the triac between the conductive and non-conductive conditions. The arrangement has the advantage that a substantially continuous charging current is supplied to the capacitor C1 through the first and second paths P1, P2 irrespective of the switching state of triac T, to provide for continuous operation of the control circuit K, with consequential reliable triggering of the triac T. The large inductive coil used in the prior art in series with the triac can be dispensed with and replaced by the essentially resistive diode arrangement D3, D4 because there is negligible RF1 to be suppressed.

The control circuit K in this embodiment of the invention comprises a proximity switch powered from the continuous supply developed across capacitor C1. An example of the proximity switch is shown in block diagrammatic form in FIG. 5, and operates by detecting radiation reflected by a target such as a hand of an operator.

An oscillator 10, which is preferably of low duty cycle and typically at 10 khz, drives a radiation emitter 11 preferably including an an infra-red LED. A detector 12 comprises a photodiode which is connected to a decoder 13 that picks out 10 khz components from detected ambient levels of light. A Schmidt trigger 14 driven by decoder 13 toggles a bistable latch 15 that by means of drive circuit 16 operates the triac T (FIG. 4) such that each time the hand is brought within a 5-100 millimeters of the emitter detector pair 11, 12 (which are mounted adjacent to one another) the switch 16 changes state. The use of a Schmidt trigger 14 inhibits multiple switching being produced by one hand movement.

Figure 5:
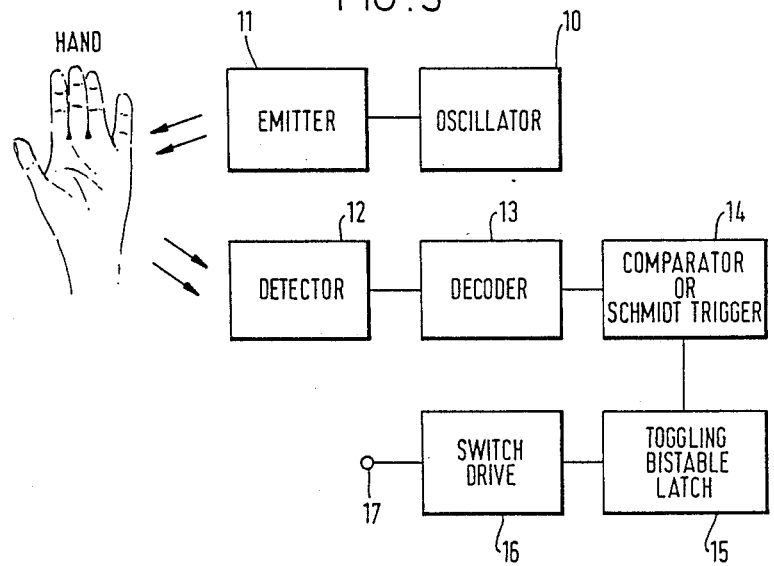
FIG. 5 is a schematic block diagram of a suitable control circuit for the preferred radiation reflective in-line proximity switch.
Figure 6:
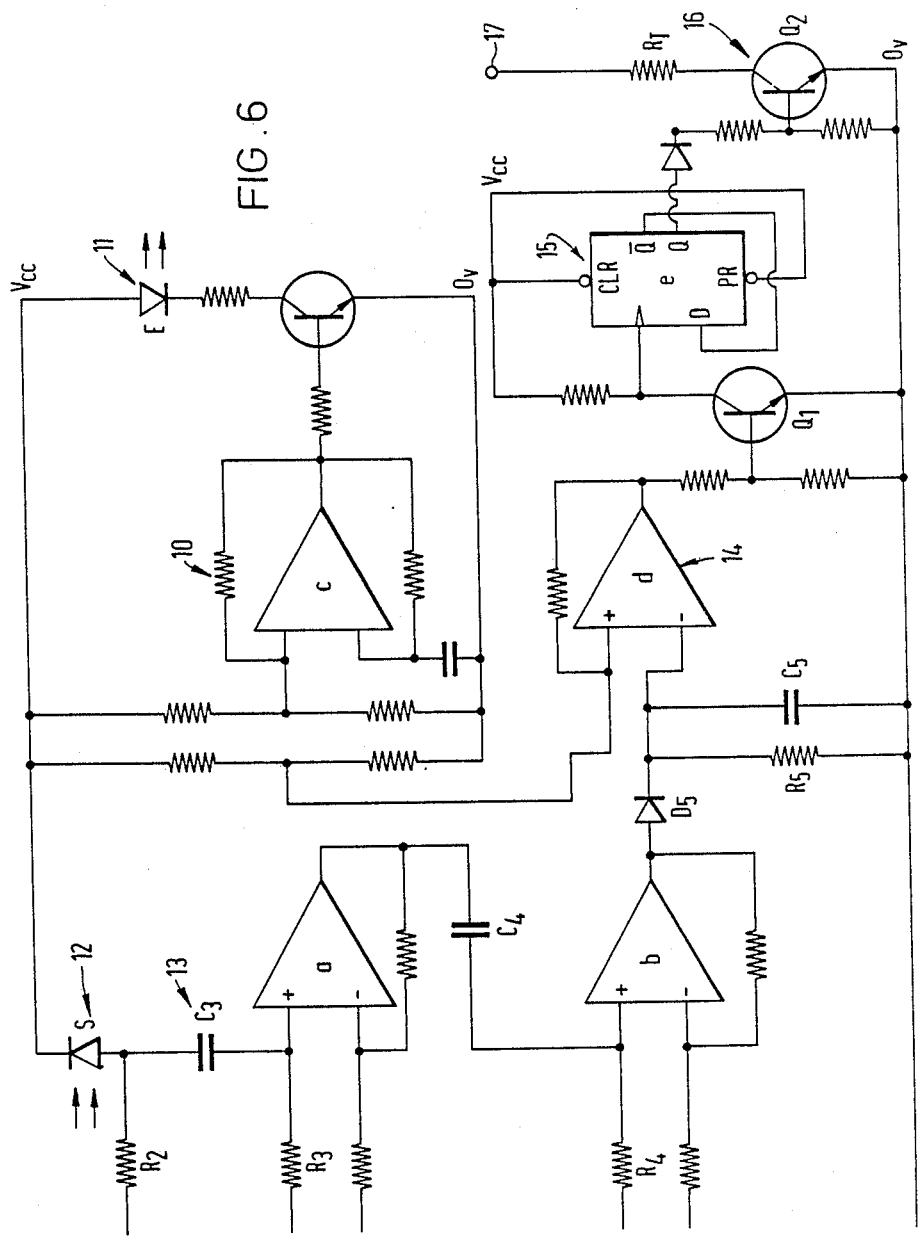
FIG. 6 is a detailed circuit diagram of a preferred control circuit

FIG. 6 shows in more detail the circuit diagram of the proximity switch and corresponds to the circuit elements 10 to 17 shown in FIG. 5. The detector 12 comprises a photodiode S the impedance of which varies with incident light intensity, causing a voltage signal across R2 which is fed to the decoder 13 in the form of a high pass filter C3, R3 that rejects ambient light signals (especially 50-60 hz variations). The resulting filtered signal is amplified by an op amp (a) (preferably ground sensing) and then passed through a high pass filter C4, R4. An op amp (b) amplifies the further filtered signal and a peak detector with low droop D5, R5, C5 converts the spikes received by photodiode S to a fairly smooth DC signal.

The circuitry around op amp (c) provides the oscillator 10 with a low duty cycle (any frequency significantly above 50-60 Hz will work). The emitter 11 comprises an infra-red LED E that emits spikes of light at the oscillator frequency. Spikes are employed for low power consumption.

An op amp (d) forms the Schmidt trigger 14. A transistor Q1 speeds up the transition time of the trigger to a level acceptable to the toggling bistable latch 15 here implemented using a D-type flip-flop (e). The output from the latch (e) switches transistor Q2 which acts as the switch drive circuit 16 and drives triac gate terminal 17. The triac gate terminal 17 can be used to control the triac T shown in FIG. 4 or in FIG. 7.

Figure 7:
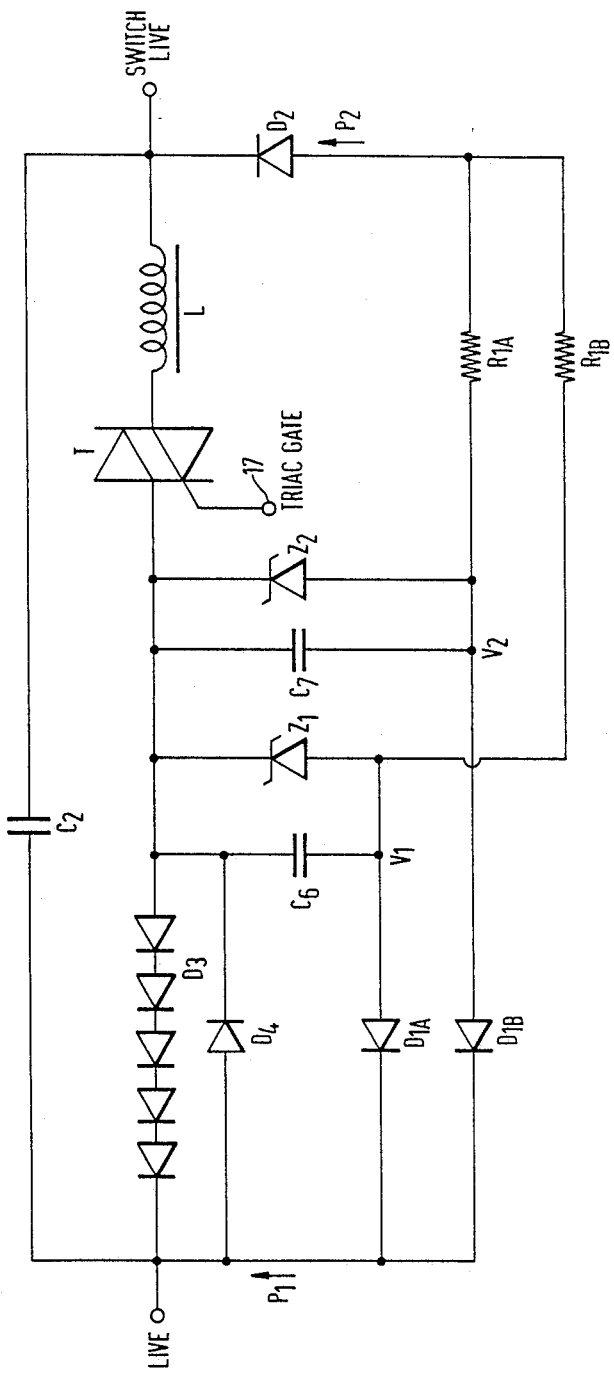
FIG. 7 shows an enhanced dual power supply for an improved in-line proximity switch.

FIG. 7 shows a dual non-switching power supply which may be used to enhance the performance of the in-line proximity switch. In FIG. 7 DIA and RIA are the first and second impedances for an "A" power supply respectively and similarly DIB and RIB are for a "B" supply. The "A" supply charges capacitor C6 and can be used to power the control circuit elements 10-15 but not the triac gate drive circuit 16 whereas the "B" supply charges capacitor C7 and can be used to supply the triac gate drive circuit 16 and triac gate 17 with current. In this way if the triac is asked to turn on when insufficient charge or voltage is present in C7 for this to occur, then the triac gate supply will fail but the control circuit supply will still be functioning, thereby allowing the circuit to turn off the triac gate drive, so that C7 can be recharged by the second current path P2. Then a turn on can be reattempted.

This problem arises because the second current path P2 may not provide enough current to drive the triac gate 17 when the triac T is on, whereas the first current path can easily provide such current. As a result if the triac T is asked to turn on, then for a few milliseconds, whilst the triac changes state, the second current path P2 will be trying to drive the gate with a current which exceeds its capabilities and so the capacitor C7 may run out of charge before turn on is affected in which case the triac will remain off with the triac gate drive on and the gate drive power supply will fail.

Figure 8A:
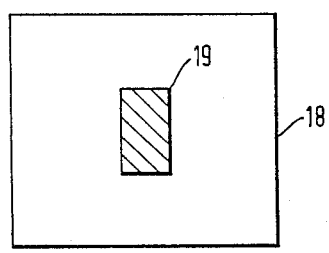
FIGS. 8(a) and 8(b) show two designs for face plates for wall mounted in-line proximity switches, being used as standard light switch or touch switch or dimer replacements.
Figure 8B:
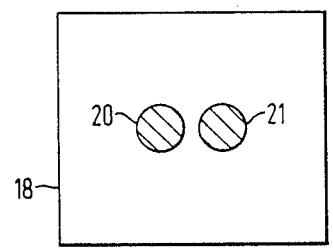

FIG. 8 shows two suitable face plate designs for wall mounted in-line electric light proximity switches. The faceplate 18 shown in FIG. 8(a) mimics a standard light switch with the rocker replaced by an infra-red transmissive cover 19 behind which the emitter and detector are arranged. The faceplate 18 of FIG. 8(b) has two infra-red transmitting covers, one for the emitter and one for the detector, both of which are mounted behind said covers.

Various modifications falling within the scope of the invention are possible. For example, whilst hereinbefore the control circuit K is described as including a proximity switch as described with reference to FIGS. 5 and 6, it would be possible instead to include a switching control device in the form of a dimmer control or a touch sensitive switching device.

I claim:

1. An electrical switch comprising:
   a line terminal;
   a switch terminal;
   switching means for controlling current flow between the line terminal and the switch terminal;
   switch control means for controlling the state of the switching means;
   first impedance means for generating a voltage drop across itself connected in series between said line terminal and said switching means;
   first and second power supply means for providing power respectively to a first part and a second part of the control means, such first and second power supply means each including charge storage means for holding a charge, the charge storage means having a first charge storage terminal and a second charge storage terminal, the first charge storage terminal being connected to the series connection between the switching means and the first impedance means, the charge storage means being charged, when the switching means is conductive, by a first current path which flows from the second charge storage terminal to the line terminal in cooperation with the potential across the first impedance means, and being charged, when the switching means is nonconductive, by a second current path which flows from the second charge storage terminal to the switch terminal in cooperation with the potential across the switching means.

2. A switch according to claim 1, wherein said first and second current paths of each of said first and second power supply means each include diode means for rendering the flow of current unidirectional through the current paths.

3. A switch according to claim 2, wherein said first and second power supply means each include voltage limiting means for limiting the maximum voltage across the charge storage means of each of said first and second power supply means.

4. A switch according to claim 3, wherein said charge storage means each comprise a capacitor and said voltage limiting means each comprise a zener diode.

5. A switch according to claim 4, wherein said first impedance means comprises an array of diodes.

6. A switch according to claim 5, wherein each said second current path includes second impedance means.

7. A switch according to claim 6, wherein each said second impedance means includes a resistor.

8. A switch according to claim 7, wherein said switch control means includes a proximity switching device operative in response to a target being placed proximate to but not actually touching the device.

9. A switch according to claim 7, wherein said switch control means includes a touch sensitive device.

10. A switch according to claim 7, wherein said switch control means includes a dimmer control.

11. An in-line proximity switch for connection in an electrical circuit including a load and first and second current supply conductors connected to the load, the switch comprising:
    line and switch line terminals;
    semiconductor switching means operative to switch current flow between the terminals;
    control circuit means including a proximity switching device operative in response to a target being placed proximate to but not actually touching the device, and drive means responsive to operation of the proximity switching device for operating the semiconductor switching means;
    first impedance means connected in series between said line terminal and said semiconductor switching means;
    first and second power supply means for driving respectively the proximity switching device and the drive means, such first and second power supply means each, including charge storage means having first and second current supply connections, means for coupling the first current supply connection of the charge storage means to the series connection of the first impedance means and the switching means, means for providing a first current charging path from said line terminal to said second current supply connection of the charge storage means for cooperating with the first impedance means to cause charging of said charge storage means when said semiconductor switching means is in a first conductive condition, and means for providing a second current charging path from said switch line terminal to said second current supply connection of the charge storage means to produce charging thereof when the semiconductor switching means is in a second different conductive condition, whereby said switch is arranged to be connected solely into one of said current supply conductors by means of said line and switch terminals.

12. A switch according to claim 11 wherein said first and second current charging paths of each of said first and second power supply means each include respective diode means to render the paths unidirectionally conductive.

13. A switch according to claim 12 wherein said first and second power supply means each include voltage limiting means for limiting the maximum voltage established across each said charge storage means of each of said first and second power supply means.

14. A switch according to claim 13 wherein said charge storage means each comprise a capacitor and said voltage limiting means each comprise a zener diode.

15. A switch according to claim 11 wherein said first impedance means comprises an array of diodes.

16. A switch according to claim 11, wherein each said second current charging path includes second impedance means.

17. A switch according to claim 11 wherein said semiconductor switching means comprises a triac.

18. A switch according to claim 11 wherein said proximity switching device comprises a radiation emitter for emitting radiation of a predetermined characteristic, a radiation detector and decoder means for providing an output indicative of whether radiation detected by the detector contains the characterisitc of the radiation emitted by the emitter.

19. A switch according to claim 18 including a Schmidt trigger responsive to changes in the output of the decoder means, and a latch driven by the Schmidt trigger, said drive means being driven by the latch.

20. A switch according to claim 18 wherein said radiation emitter comprises an infra-red LED driven by an oscillator of low duty cycle to impart said predetermined characteristic to the emitted radiation.

21. A switch according to claim 16 wherein each said second impedance means includes a resistor.

22. An electrical switch comprising:
line and switch line terminals;
semiconductor switching means operative to switch current flow between the terminals;
control circuit means including an electrical switching control device, and drive means responsive to the switching state of the switching control device for operating the semiconductor switching means;
first impedance means connected in series between said line terminal and said semiconductor switching means;

first and second power supply means for driving respectively said electrical switching control device and said drive means, such first and second power supply means each including charge storage means having first and second current supply connections, means for coupling the first current supply connection of the charge storage means to the series connection of the first impedance means and the switching means, means for providing a first current charging path from said line terminal to said second current supply connection of the charge storage means for cooperating with the first impedance means to cause charging of said charge storage means when the semiconductor switching means is in a first conductive condition, and means for providing a second current charging path from said switch line terminal to said second current supply connection of the charge storage means to produce charging thereof when said semiconductor switching means is in a second different conductive condition whereby said switch is arranged to be connected solely into one of said current supply conductors by means of said line and switch line terminals.

23. A switch according to claim 22 wherein said switching control device comprises a touch sensitive device.

24. A switch according to claim 22 wherein the switching control device comprises a dimmer control.

25. A switch according to claim 22 wherein said line and switch line terminals are the sole connections thereof, for connection into one of a plurality of current supply conductors that supply current through a load.

* * * * *